US006788059B2

(12) United States Patent
Lee et al.

(10) Patent No.: US 6,788,059 B2
(45) Date of Patent: Sep. 7, 2004

(54) RF DETECTOR ARRAY FOR MAGNETIC RESONANCE IMAGING

(75) Inventors: Ray Fli Lee, Clifton Park, NY (US); William Alan Edelstein, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/063,844

(22) Filed: May 17, 2002

(65) Prior Publication Data

US 2003/0214299 A1 Nov. 20, 2003

(51) Int. Cl.[7] .................................................. G01V 3/00
(52) U.S. Cl. ...................................... 324/319; 324/318
(58) Field of Search ................................ 324/319, 318, 324/322, 309, 307, 320; 600/422; 335/299

(56) References Cited

U.S. PATENT DOCUMENTS

| 4,594,566 | A | * | 6/1986 | Maudsley ..................... 333/219 |
| 4,686,473 | A | * | 8/1987 | Chesneau et al. ........... 324/320 |
| 4,825,162 | A | | 4/1989 | Roemer et al. .............. 324/318 |
| 5,642,048 | A | * | 6/1997 | Crozier et al. ............... 324/318 |
| 5,990,681 | A | * | 11/1999 | Richard et al. .............. 324/318 |
| 6,369,550 | B1 | | 4/2002 | Lou et al. .................... 323/208 |

FOREIGN PATENT DOCUMENTS

WO    WO 96/34369    * 10/1996    ....... G01R/33/2315

OTHER PUBLICATIONS

KP Pruessmann, M Weiger, M Scheidegger, P Doesiger, "SENSE: Sensitivity Encoding for Fast MRI," Magnetic Resonance in Medicine 42:952–962 (1999).

RF Lee, CR Westgate, RG Weiss, DC Newman, RA Bottomley, "Planar Strip Array (PSA) for MRI," Magnetic Resonance in Medicine 45:673–683 (2001).

Patent Application, "Multiple Channel, Microstrip Transceiver Volume Array For Magnetic Resonance Imaging," Ser. No. 10/063,223, filed Apr. 1, 2002 by GE Medical Systems.

WE Kyriakos, LP Panych, DF Kacher, C–F Westin, SM Bao, RV Mulkern, FA Jolesz, "Sensitivity Profiles From An Array Of Coils For Encoding and Reconstruction In Parallel (SPACE RIP)," Magnetic Resonance in Medicine 44: 301–308 (2000).

* cited by examiner

*Primary Examiner*—Brij B. Shrivastav
(74) *Attorney, Agent, or Firm*—Jean K. Testa; Patrick K. Patnode

(57) ABSTRACT

A radio frequency (RF) detector array and a MRI system are provided. The detector array comprises a plurality of conductive array elements being substantially parallel to a conductive ground plane, a plurality of capacitors, wherein at least one capacitor is shunted from each array element to the ground plane to adjust a corresponding electrical length of each conductive array element, and, wherein a combination of each respective array element, at least one corresponding capacitor and the ground plane forms a resonator that resonates at a selected frequency. The detector array further a decoupling interface, and a plurality of matching boxes for matching each decoupled conductive strip to a selected impedance. A MRI system is provided including a detector array as described herein to produce MR images of the object to be imaged.

17 Claims, 4 Drawing Sheets

(a) TRANSMISSION LINE, λ/4 OF INTEGER OF λ/4  300

(b) REDUCED-LENGTH TRANSMISSION LINE  310  330

(c) SLOW-WAVE STRUCTURE  320  340

RF DETECTOR ARRAY FOR MAGNETIC RESONANCE IMAGING

BACKGROUND OF INVENTION

This invention relates generally to magnetic resonance imaging (MRI), and more particularly, to radio frequency (RF) coil arrays used for MRI.

Generally, MRI is a well-known imaging technique. A conventional MRI device establishes a homogenous magnetic field, for example, along an axis of a person's body that is to undergo MRI. This homogeneous magnetic field conditions the interior of the person's body for imaging by aligning the nuclear spins of nuclei (in atoms and molecules forming the body tissue) along the axis of the magnetic field. If the orientation of the nuclear spin is perturbed out of alignment with the magnetic field, the nuclei attempt to realign their nuclear spins with an axis of the magnetic field. Perturbation of the orientation of nuclear spins may be caused by application of radio frequency (RF) pulses. During the realignment process, the nuclei precess about the axis of the magnetic field and emit electromagnetic signals that may be detected by one or more coils placed on or about the person.

The frequency of the magnetic resonance (MR) signal emitted by a given precessing nucleus depends on the strength of the magnetic field at the nucleus' location. As is well known in the art, it is possible to distinguish radiation originating from different locations within the person's body by applying a field gradient to the magnetic field across the person's body. For the sake of convenience, direction of this field gradient may be referred to as the left-to-right direction. Radiation of a particular frequency may be assumed to originate at a given position within the field gradient, and hence at a given left-to-right position within the person's body. The application of such a field gradient is also referred to as frequency encoding.

However, the application of a field gradient does not allow for two-dimensional resolution, since all nuclei at a given left-to-right position experience the same field strength, and hence emit radiation of the same frequency. Accordingly, the application of a frequency-encoding gradient, by itself, does not make it possible to discern radiation originating from the top versus radiation originating from the bottom of the person at a given left-to-right position. Resolution has been found to be possible in this second direction by application of gradients of varied strength in a perpendicular direction to thereby perturb the nuclei in varied amounts. The application of such additional gradients is also referred to as phase encoding.

Frequency-encoded data sensed by the coils during a phase encoding step is stored as a line of data in a data matrix known as the k-space matrix. Multiple phase encoding steps are performed in order to fill the multiple lines of the k-space matrix. An image may be generated from this matrix by performing a Fourier transformation of the matrix to convert this frequency information to spatial information representing the distribution of nuclear spins or density of nuclei of the image material.

Imaging time is largely a factor of desired signal-to-noise ratio (SNR) and the speed with which the MRI device can fill the k-space matrix. In conventional MRI, the k-space matrix is filled one line at a time. Although many improvements have been made in this general area, the speed with which the k-space matrix may be filled is limited. To overcome these inherent limits, several techniques have been developed to simultaneously acquire multiple lines of data for each application of a magnetic field gradient. These techniques, which may collectively be characterized as "parallel imaging techniques", use spatial information from arrays of RF detector coils to substitute for the encoding which would otherwise have to be obtained in a sequential fashion using field gradients and RF pulses. The use of multiple effective detectors has been shown to multiply imaging speed, without increasing gradient switching rates or RF power deposition.

One such multiple detector configuration is the planar strip array (PSA), in which multiple conductive microstrips are arranged in parallel within a high permittivity substrate and overlay. The planar strip array is mainly appreciated in two different areas in MRI-parallel imaging and open MRI systems. In parallel imaging, the PSA presents a way to implement a large number of element detectors. Although the conventional MRI phased array is widely used in parallel imaging, its loop structure and the decoupling methods impose some restrictions on further increasing the number of the elements in phased array. In the second area, open magnet systems, the magnetic field direction of the PSA is perpendicular to the static magnetic field unlike the circular loop coil whose magnetic field direction is parallel to the static magnetic field. Thus, conventional circular loop coils cannot excite the nuclear spins if they are laid on patient table in scanner.

The key element of PSA is transmission line resonator. Its resonant condition is that its electrical length should be either $\pi/2$ or $\pi$, which normally requires its physical length to be a quarter, or a half, wavelength of the resonant wavelength. Practically, for a 7 T whole body MRI scanner, the resonant wavelength in air is 1 m, therefore a quarter wavelength of conductor strip in air is 25 cm, which is a reasonable length for a RF detector inside MRI scanner. But for a 1.5 T MRI scanner, the resonance wavelength in air is 4.697 m, a quarter wavelength of conductor strip in air is 1.17 m, which is too long to be an effective RF detector.

Generally, the planar strip array has been used for receive mode only, due to its decoupling scheme which partially relies on low impedance (less that 2 Ω preamplifiers. Since the output impedance of the transmit power amplifier is usually 50 Ω, the coupling among the strip array cannot be fully resolved during transmit.

What is needed is a radio frequency (RF) coil assembly, such as a planar strip array, for use in MRI systems of a given field strength. What is further needed is a transmit and receive RF coil array.

SUMMARY OF INVENTION

In a first aspect, a radio frequency (RF) detector array for use with a magnetic resonance imaging (MRI) system is provided. The detector array comprises a plurality of conductive array elements being substantially parallel to a conductive ground plane, a plurality of capacitors, wherein at least one capacitor is shunted from each array element to the ground plane to adjust a corresponding electrical length of each conductive strip, and, wherein a combination of each respective array element, at least one corresponding capacitor and the ground plane forms a resonator that resonates at a selected frequency.

In a second aspect, a MRI system is provided comprising a computer, a magnet assembly for generating a polarizing magnetic field, a gradient coil assembly for applying gradient waveforms to the polarizing magnetic field along selected gradient axes, and a detector array as described above for applying RF energy to excite nuclear spins of an object to be imaged, and for thereafter detecting signals generated by excited nuclei of the object to be imaged, wherein signals detected by the detector array are processed by the computer to produce MR images of the object to be imaged.

BRIEF DESCRIPTION OF DRAWINGS

The features and advantages of the present invention will become apparent from the following detailed description of the invention when read with the accompanying drawings in which.

DETAILED DESCRIPTION

Figure 1:
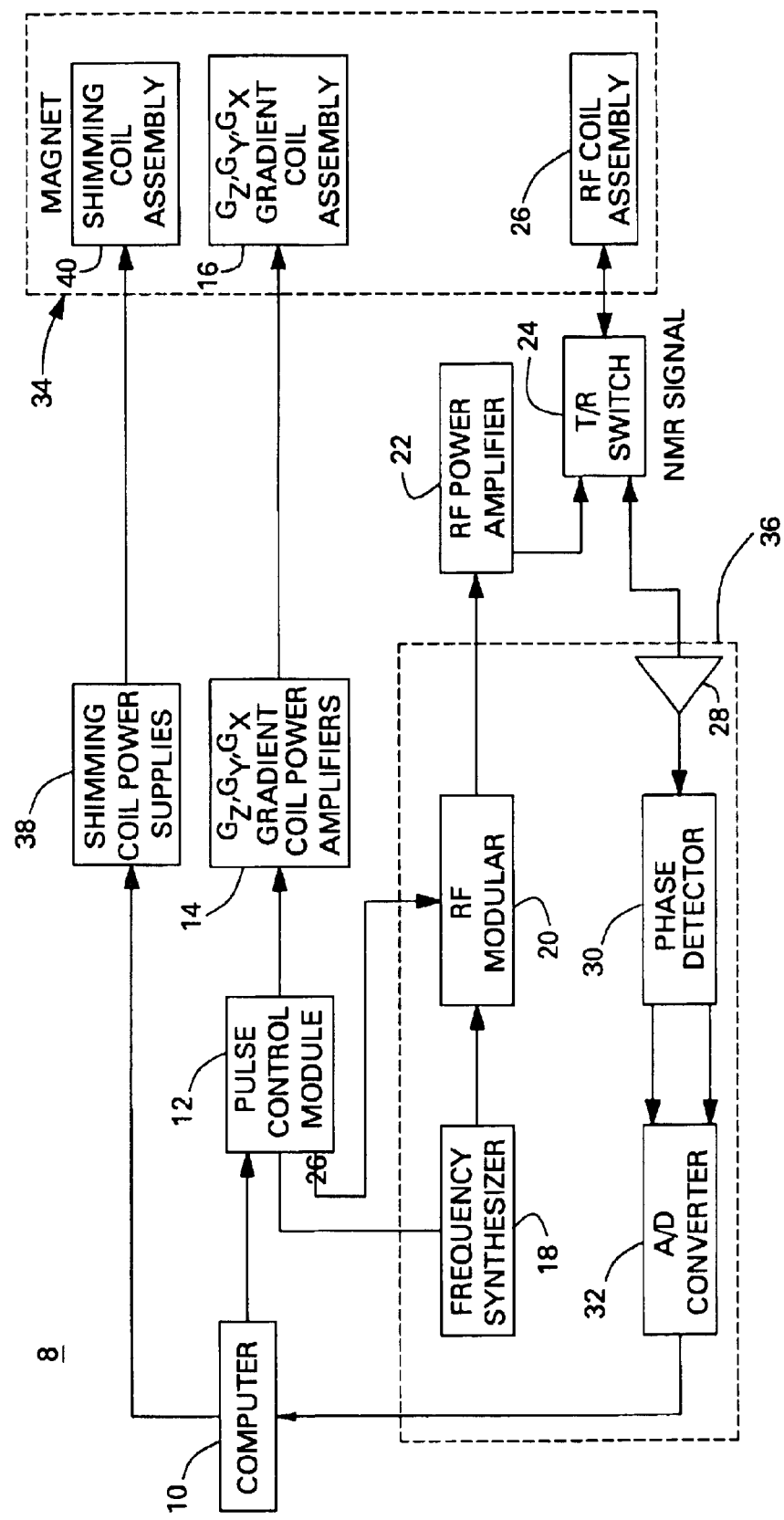
FIG. 1 is a schematic block diagram of an exemplary MR imaging system suitable for use with the present invention embodiments.

Referring initially to FIG. 1, an exemplary magnetic resonance (MR) imaging system includes a computer 10, which controls gradient coil power amplifiers 14 through a pulse control module 12. The pulse control module 12 and the gradient amplifiers 14 together produce the proper gradient waveforms Gx, Gy, and Gz, for either a spin echo, a gradient recalled echo pulse sequence, a fast spin echo, or other type of pulse sequences. The gradient waveforms are connected to gradient coils 16, which are positioned around the bore of an MR magnet assembly 34 so that gradients Gx, Gy, and Gz are impressed along their respective axes on the polarizing magnetic field $B_0$ from magnet assembly 34.

The pulse control module 12 also controls a radio frequency synthesizer 18 that is part of an RF transceiver system, portions of which are enclosed by dashed line block 36. The pulse control module 12 also controls an RF modulator 20, which modulates the output of the radio frequency synthesizer 18. The resultant RF signals, amplified by power amplifier 22 and applied to a RF coil assembly 26 through transmit/receive switch 24, are used to excite the nuclear spins of the imaged object (not shown).

The MR signals from the excited nuclei of the imaged object are picked up by RF coil assembly 26 and presented to preamplifier 28 through transmit/receive switch 24, to be amplified and then processed by a quadrature phase detector 30. The detected signals are digitized by a high speed A/D converter 32 and applied to computer 10 for processing to produce MR images of the object. Computer 10 also controls shimming coil power supplies 38 to power shimming coil assembly 40.

In embodiments of the present invention, RF coil assembly 26 is a RF detector array consisting of multiple detector elements, such as loops or conductive strips and may also be configured as an array of multiple coils or conductive strips. Other conductive materials and structures, for example copper rods, pipes, wires or other similar line structures, may also be used as detector elements. In a further embodiment, RF coil assembly 26 is a MRI phased array. An embodiment employing conductive strips will be described in greater detail below with reference to FIGS. 2 and 3. Also, in embodiment of the present invention, the detector elements may be non-overlapping or over-lapping.

In addition, the SNR may be even further improved by implementing a multiple channel array for receive coil assembly 26. In so doing, a parallel processing technique such as SENSE (described above) may then be used to improve data acquisition time. At relatively high $B_0$ field strengths (e.g.,>3 T), the homogeneity of the RF excitation field becomes largely dependent upon the electrical properties and size of the patient. However, if the transmit coil were also implemented in an array configuration, then the current amplitude and phase in each array element could be individually regulated such that the homogeneity of the RF excitation field is optimized in the presence of the patient.

Figure 2:
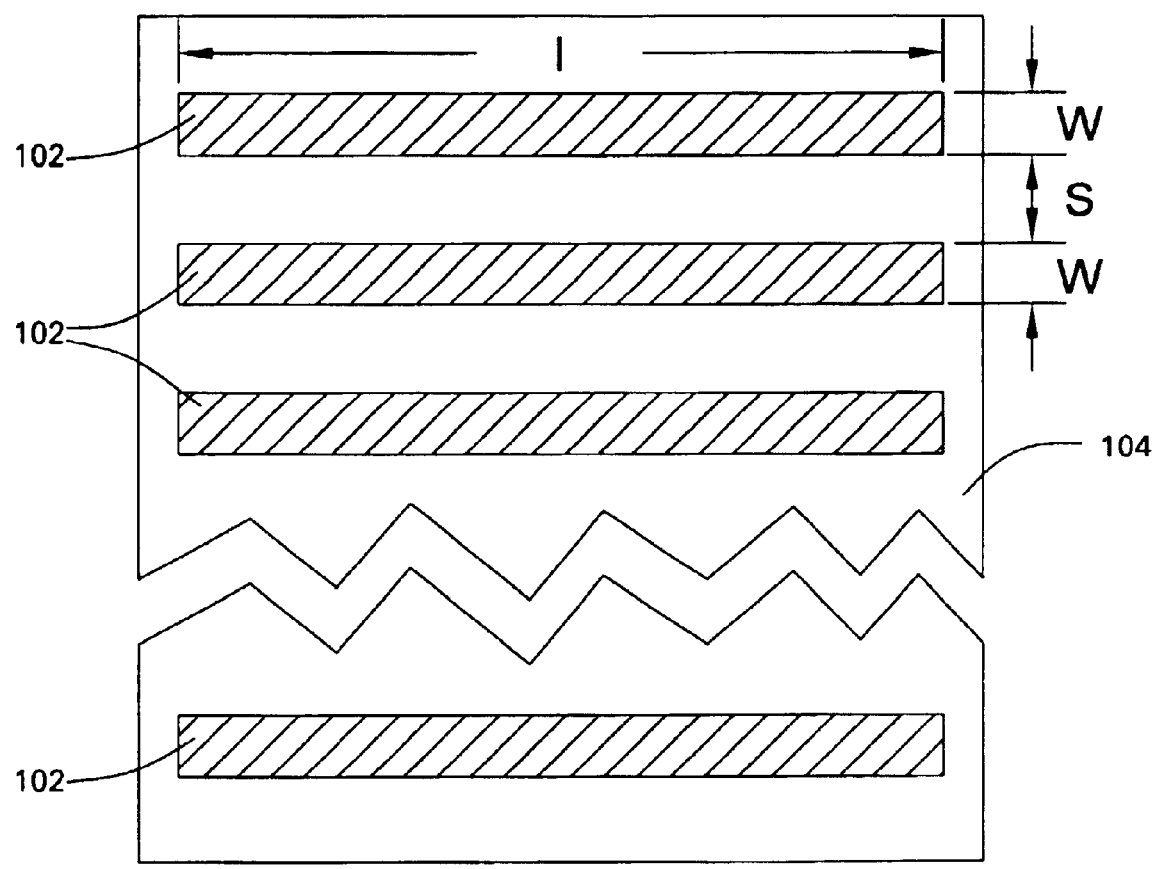
FIG. 2 a planar view of a detector array to which embodiments of the invention are applicable.

Referring now to FIG. 2, there is shown a planar view of a microstrip array 100 which may be subsequently configured in a generally planar configuration for RF detector applications such as a surface coil. Alternatively, microstrip array 100 may be configured in a cylindrical fashion to form a multiple channel volume resonator. The array 100 includes a series of parallel, commensurate-length conductive (e.g., copper) microstrips 102 having a dielectric overlay 104 thereon. The dielectric medium selected for the overlay 102 may be, for example, glass having a relative dielectric constant of $\epsilon_r=6.4$. The dielectric medium material reduces the electromagnetic frequency (EMF) wavelength by a factor of $\epsilon_r^{1/2}$ in order to make, for example, a quarter wavelength ($\lambda/4$) resonator at the MRI frequency correspond to a reasonable length for a receiving array. Thus, in a 1.5 Tesla (T) system with a proton resonance of 63.87 MHz, the quarter wavelength ($\lambda/4$) is reduced from 117 cm to 46 cm in the glass medium. It is to be appreciated that the microstrip configuration allows for isolation between each of the 16 individual array elements, thereby enabling each element to be driven individually if so desired. On the receiving end, the volume resonator may be used as either a 16-channel phased array for SNR improvement, or for parallel image processing techniques such as SENSE.

As described by Lee, et al. in Magnetic Resonance in Medicine, 45:673–683 (2001), the strip length/can be a quarter wavelength ($\lambda/4$) or a half wavelength ($\lambda/2$), while the strip width w, spacing s, and dielectric thickness h are chosen to make the characteristic impedance of the strip match the impedance of connecting cables thereto (not shown). One advantage of the microstrip array 100 over a conventional loop design is that the length of the strips 102 may be adjusted such that the coupling between the strips is minimized, regardless of the spacing s therebetween. In one embodiment, using a group of quarter wavelength ($\lambda/4$) strips (or integral multiples thereof) terminated by either an open circuit or a short circuit results in standing wave resonance within the strips. In an alternative embodiment, using a group of half wavelength ($\lambda/2$) strips (or integral multiples thereof) terminating with matched impedance loads results in traveling wave resonance within the strip. In both embodiments, the strips are decoupled from one another (as is described in greater detail by Lee, et al.), thereby providing high SNR on each of the isolated strips.

Figure 3:
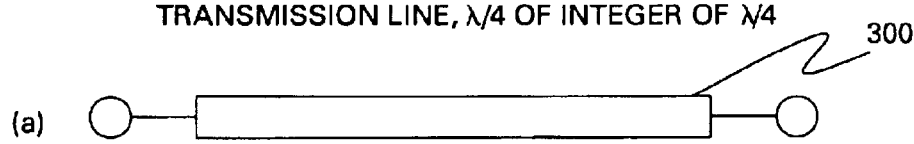
FIG. 3 is a schematic illustration of three embodiments of conductor elements of a detector array to which embodiments of the invention are applicable.
Figure 3:
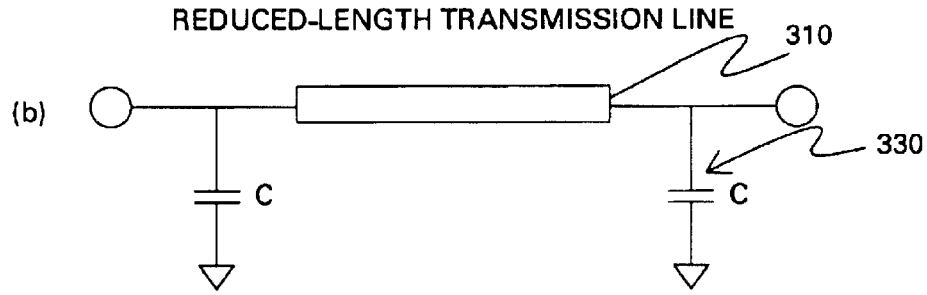
Figure 3:
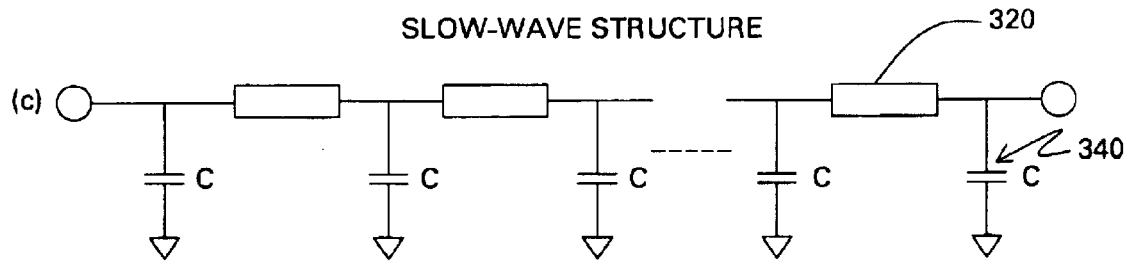

It should further be noted at this point that the actual physical length of the strip array may be allowed to vary, so long as the desired electrical wavelength of the strip is achieved. The physical length of the strip can be varied to alter the electrical wavelength of the strip. Generally, the electrical length θ 0 should desirably be $\pi/2$ or $\pi$, which requires the physical length be a quarter or a half, wavelength of the resonant wavelength. Practically, for a 7 T whole body MRI scanner, the resonant wavelength in air is about 1 m, therefore the quarter wavelength of a conductive strip in air is 25 cm, which is a reasonable length for a RF detector inside a MRI scanner. However, for lower field MRI scanners (for example, 1.5 T), the resonant wavelength in air is 4.967 m. Thus, a quarter wavelength of a conductor strip in air is 1.17 m, which is too long to be an effective RF detector. To this end, for lower field MRI applications, lumped element reactances may be added to get the selected electrical wavelength. FIG. 3 schematically illustrates a pair of strips (a), (b) represented as transmission lines. In (a), the actual strip length/is equal to a desired electrical wavelength $\theta_0$ (e.g., $\lambda/4,\lambda/2$). With an appropriate termination, strip (a) shown as 300 will naturally be decoupled from a neighboring strip of the same length and termination. However, in strip (b), the actual strip length/is shorter than the desired electrical wavelength $\theta_0$, instead having an electrical wavelength $\theta$. In order to achieve the desired electrical wavelength $\theta_0$ (310), lumped elements such as capacitors C1 and C2 (330) may be added to strip 310. A third alternative is (c) in which the strip is configured as a multiple segmented structure in which the individual segments 320 combine to have the same electrical length of (a), 300. In this third embodiment, further provided are capacitors 340 in series connection along the strip between respective neighboring segments.

In a first embodiment, a RF detector array for use with a magnetic resonance imaging (MRI) system is provided. Referring further to FIG. 2, in an embodiment of the RF detector array, the array comprises a plurality of conductive strips 102 being substantially parallel to a conductive ground plane (not shown) and a plurality of capacitors C1 and C2 (330 of FIG. 3), wherein at least one capacitor is shunted from each strip to the ground plane to adjust a corresponding electrical length of each conductive strip. The combination of each respective strip, at least one corresponding capacitor and the ground plane forms a resonator that resonates at a selected frequency. Conductive strips 102 may be substituted with other conductive array elements, as described above, for example rods, pipes, wires and the like.

In a further embodiment of the RF detector array, the array comprises a plurality of commensurate microstrips formed within a dielectric medium, each microstrip being adjusted to an integer multiple of a quarter-wavelength of a selected resonance wavelength by adjusting both strip length and a dielectric constant of the medium and at least one termination at each microstrip, the termination being selected from a group consisting of short circuit, open circuit, and reactive terminations.

In further embodiments, the RF detector array further comprises a plurality of capacitors connected in a series connection between multiple sections within each strip for matching and reducing electrical field. In another further embodiment, the RF detector array comprises a plurality of capacitors interconnected between each strip and respective neighbor strips to decouple mutual inductance between respective pairs of array elements.

In this embodiment, the detector array, or alternatively "planar strip array" is useful when implementing a large number of RF detectors such as in parallel imaging. Also, it is to be appreciated that this embodiment is applicable for a variety of field strengths of a MRI system. Physical length of the conductive elements is no longer a limitation.

Additionally, the RF detector array may further comprise a decoupling interface coupled to an end of each conductive strip or element for decoupling each conductive strip from the remaining conductive strips when the strips are mutual inductively coupled. Further, a plurality of matching boxes for matching each decoupled conductive strip to a selected impedance for any unmatched strips.

Additionally, the RF detector array is operable as a transmit-only detector, receive-only detector or a transmit and receive detector. The only exception for transmit and receive detector operation occurs when the array uses interconnecting capacitors to decouple partial array elements and also uses low input preamplifiers to decouple the remainder of the array elements.

A key element of planar strip arrays is the transmission line resonator. Its resonant condition is that its electrical length should be either $\pi/2$ or $\pi$, which normally requires its physical length to be a quarter, or a half, wavelength of the resonant wavelength. Practically, for a 7 T whole body MRI scanner, the resonant wavelength in air is 1 m, therefore a quarter wavelength of conductor strip in air is 25 cm, which is a reasonable length for a RF detector inside MRI scanner. But for a 1.5 T MRI scanner, the resonance wavelength in air is 4.697 m, a quarter wavelength of conductor strip in air is 1.17 m, which is too long to be an effective RF detector.

There are two methods to reduce the physical length of transmission line while keeping its electrical length unchanged to sustain its resonant frequency. One method, which is to embed the conductor strip in a high dielectric constant substrate. If the dielectric constant of the substrate is $\xi_r$, then the wavelength of EMF inside substrate is reduced by a factor of $\sqrt{\epsilon_r}$. However, to implement the concept of PSA in a 1.5 T scanner, and to reduce the quarter wavelength strip from 1.17 m to about 0.2~0.4 m, it requires that the dielectric constant of the substrate is in the range from 8.6 to 34.2. The problem with this method is that the materials with such high dielectric constant are usually very lossy, which could cause serious signal to noise ratio (SNR) reduction. The high dielectric constant materials with low loss are often very expensive.

Figure 4:
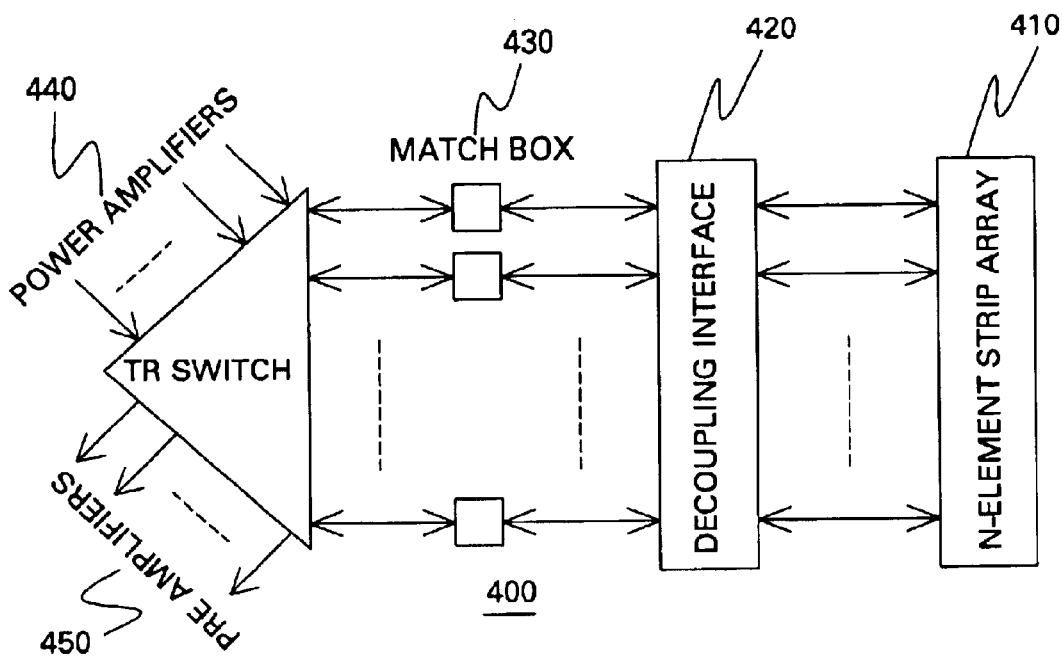
FIG. 4 is a schematic block diagram of a RF detector array assembly to which embodiments of the invention are applicable; and, FIG. 5 is a schematic block diagram of an embodiment of a detector array and decoupling interface for use with the present invention.

Referring to FIG. 4, in accordance with another embodiment of the present invention, a RF detector array assembly for use with a magnetic resonance imaging (MRI) system is provided. The array comprises a plurality of conductive strips being substantially parallel to a conductive ground plane and a plurality of capacitors, wherein at least one capacitor is shunted from each strip to the ground plane to adjust a corresponding electrical length of each conductive strip. The combination of each respective strip, at least one corresponding capacitor and the ground plane forms a resonator that resonates at a selected frequency. Further, the assembly comprises a decoupling interface coupled to an end of each conductive strip for decoupling each conductive strip from the remaining conductive strips when the strips are mutual inductively coupled and a plurality of matching boxes for matching each decoupled conductive strip to a selected impedance for any unmatched strips. Additionally, the RF detector array is operable as a transmit-only detector, receive only detector or a transmit and receive detector. The only exception for transmit and receive detector operation occurs when the array uses interconnecting capacitors to decouple partial array elements and also uses low input preamplifiers to decouple the remainder of the array elements.

Also referring to FIG. 4, the array assembly further comprises a transmit/receive switch 440 coupled to a plurality of pre-amplifiers 450 and a plurality of power amplifiers 440. The pre-amplifiers and power amplifiers operate in a manner well known in the art. Decoupling interface 420 may be reactive lumped-element circuits, distributive structures, transmission line or coils. Matching boxes 430 may be lumped-element circuits or transmission lines.

The detector array is made from a number n of parallel identical line resonators that can be transmission line, reduced-length transmission line, or slow wave structure transmission line as shown in FIG. 3. The electrical length of the resonator should be integer times of λ/4. The termination of the resonator can be short, open, or reactive termination. The spacing of the line resonators can be the same, or in certain designed distribution.

Figure 5:
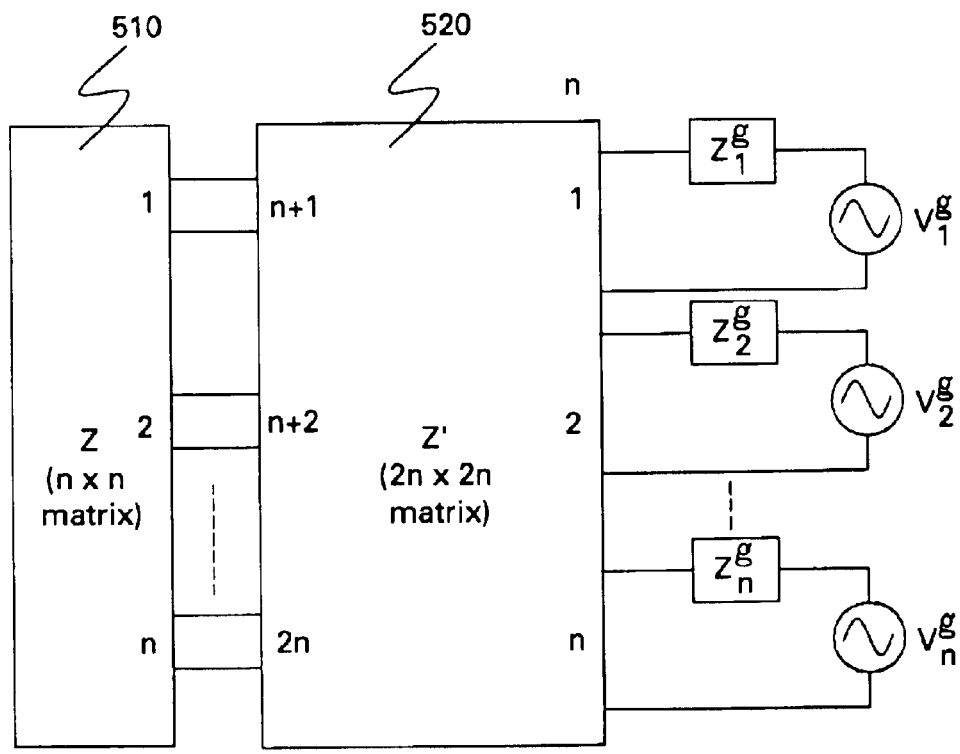

A further embodiment for a decoupling interface is shown in FIG. 5. Referring to FIG. 5, there is shown an embodiment of a RF detector array assembly 500 for use in parallel imaging. In an embodiment of the present invention, a radio frequency (RF) detector array assembly is provided for use in a MRI system. The RF detector array assembly comprises at least one RF detector array 510, as described above wherein the array has a plurality of RF detector elements (n) for use in simultaneously acquiring RF signals from the MRI system, and a decoupling interface 520 coupled to each of the plurality of detector elements for decoupling each element from the remaining elements. As described above, the array may be a phased array, a multiple coil array or, alternatively, a microstrip array. The elements, for example coils or strips, may be non-overlapping or overlapping. In the embodiments described hereinafter, the coils and/or strips are referred to as "elements" and are non-overlapping. It is to be appreciated that the decoupling interface arrangement is also applicable to arrays having overlapping elements.

An N-element strip array can be characterized by its impedance matrix Z, $$Z = \begin{pmatrix} Z_{11} & \cdots & Z_{1n} \\ \vdots & \ddots & \vdots \\ Z_{n1} & \cdots & Z_{nn} \end{pmatrix},$$

where the diagonal component $Z_{ii}$ (i=1,2, ..., n) is the self-impedance of the $i^{th}$ element (typically a "tuned and matched" coil) when all other ports are open-circuited. The real part of $Z_{ii}$ represents transformed resistive losses in the element (e.g. sample losses) while the imaginary part is the transformed reactance of the element. The mutual impedance $Z_{ij}$ (i,j=1,2, ..., n;i≠j) between two ports i and j is the open circuit voltage produced at the $i^{th}$ port divided by the current supplied to the $j^{th}$ port when all other ports are open-circuited. The real part of $Z_{ij}$ is the mutual resistance (associated with noise correlation) between coil elements i and j, and the imaginary part of $Z_{ij}$ is the reactive coupling, which is mainly inductive coupling between coil elements i and j.

When the strip array has N elements, its impedance matrix Z is a n×n matrix. The decoupling interface for such N element system is a 2N port system, which has 2 n×2n impedance matrix Z', When the strip array has N elements, its impedance matrix Z is a n×n matrix. The decoupling interface for such N element system is a 2N port system, which has 2n×2n impedance matrix Z', $$Z' = \begin{pmatrix} Z'_{11} & \cdots & Z'_{1n} & Z'_{1(n+1)} & \cdots & Z'_{1(2n)} \\ \vdots & \ddots & \vdots & \vdots & \ddots & \vdots \\ Z'_{n1} & \cdots & Z'_{nn} & Z'_{n(n+1)} & \cdots & Z'_{n(2n)} \\ Z'_{(n+1)1} & \cdots & Z'_{(n+1)n} & Z'_{(n+1)(n+1)} & \cdots & Z'_{(n+1)(2n)} \\ \vdots & \ddots & \vdots & \vdots & \ddots & \vdots \\ Z'_{(2n)1} & \cdots & Z'_{(2n)n} & Z'_{(2n)(n+1)} & \cdots & Z'_{(2n)(2n)} \end{pmatrix}.$$

Let the four n×n submatrices of Z' be $$\hat{Z}'_{11} = \begin{pmatrix} Z'_{11} & \cdots & Z'_{1n} \\ \vdots & \ddots & \vdots \\ Z'_{n1} & \cdots & Z'_{nn} \end{pmatrix}, \quad \hat{Z}'_{12} = \begin{pmatrix} Z'_{1(n+1)} & \cdots & Z'_{1(2n)} \\ \vdots & \ddots & \vdots \\ Z'_{n(n+1)} & \cdots & Z'_{n(2n)} \end{pmatrix},$$

$$\hat{Z}'_{21} = \begin{pmatrix} Z'_{(n+1)1} & \cdots & Z'_{(n+1)n} \\ \vdots & \ddots & \vdots \\ Z'_{(2n)1} & \cdots & Z'_{(2n)n} \end{pmatrix}, \quad \hat{Z}'_{22} = \begin{pmatrix} Z'_{(n+1)(n+1)} & \cdots & Z'_{(n+1)(2n)} \\ \vdots & \ddots & \vdots \\ Z'_{(2n)(n+1)} & \cdots & Z'_{(2n)(2n)} \end{pmatrix},$$

The decoupling interface can have many different forms that satisfy the decoupling equation:

$$\hat{Z}'_{11} - \hat{Z}'_{12}(\hat{Z}'_{22}+Z)^{-1}\hat{Z}'_{21} = Z''$$

where $$Z'' = \begin{pmatrix} Z''_{11} & 0 & \cdots & 0 \\ 0 & Z''_{22} & \cdots & 0 \\ \vdots & & \ddots & \vdots \\ 0 & 0 & \cdots & Z''_{nn} \end{pmatrix}$$

The decoupling interface 520 can be made from reactive lumped-elements, distributive structures, transmission line, or coils, or the like as known by one skilled in the art.

The matching box matches each decoupled channel into desired impedance, normally 50 Ω. It can be any form of lumped-element circuits or transmission line matching scheme.

In further embodiments of the transmit and receive array assembly, the array assembly further a plurality of couplers disposed between said conductive strips for interconnecting said strips and for tuning said strips. In another further embodiment, the conductive strips are disposed between the decoupling interface and the matching boxes. Alternatively, the matching boxes are disposed between the strips and the decoupling interface.

In another embodiment of the present invention, a magnetic resonance imaging (MRI) system is provided. The system comprises a computer, a magnet assembly for generating a polarizing magnetic field, a gradient coil assembly for applying gradient waveforms to said polarizing magnetic field along selected gradient axes and a detector array for applying RF energy to excite nuclear spins of an object to be imaged wherein the detector array employs methods and embodiments described above. The detector is also for thereafter detecting signals generated by excited nuclei of the object to be imaged. In a further embodiment, the system further comprises a decoupling interface coupled to each conductive strip for decoupling the conductive strip from the remaining conductive strips and a plurality of matching boxes coupled for matching each decoupled conductive strip to a selected impedance.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A radio frequency (RF) detector array for use with a magnetic resonance imaging (MRI) system, comprising:
    a plurality of conductive array elements being substantially parallel to a conductive round plane;
    a plurality of capacitors, wherein at least one capacitor is shunted from each array element to the ground plane configured to selectively adjust a corresponding electrical length of each conductive array element; and,
    wherein a combination of each respective array element, at least one corresponding capacitor and the ground plane forms a resonator that resonates at a selected frequency and the combination being adaptable for a plurality of field strengths.

2. The RF detector array of claim 1 wherein the array elements are selected from a group of structures consisting of conductive strips, rod, pipe, wire, and line structures.

3. The RF detector array of claim 1 further comprising a plurality of capacitors interconnected between each array element and respective neighbor array elements to decouple a mutual inductance between the respective pairs of array elements.

4. The RF detector array of claim 1 further comprising a decoupling interface coupled to an end of each array element for decoupling each array element from the remaining array elements when the array elements are mutual inductively coupled.

5. The RF detector array of claim 1 wherein each of said plurality of array elements comprise a plurality of segments and further comprise a plurality of capacitors in series connection along the strip between respective neighboring segments of said array element for matching and reducing electrical field.

6. The RF detector array of claim 4 further comprising a plurality of matching devices for matching each decoupled array element to a selected impedance for any unmatched array elements.

7. The RF detector array of claim 4, wherein said decoupling interface comprises at least one of reactive lumped-element circuits and distributive structure devices.

8. The RF detector array of claim 6 wherein said matching devices comprises at least one of lumped-element circuits and distributive structure devices.

9. The RF detector array of claim 1 wherein the detector array is operable as a receive-only detector.

10. The RF detector array of claim 1 wherein the detector array is operable as a transmit-only detector.

11. The RF detector array of claim 1 wherein the detector array is operable as a transmit and receive detector.

12. A magnetic resonance imaging (MRI) system, comprising:
    a computer;
    a magnet assembly for generating a polarizing magnetic field;
    a gradient coil assembly for applying gradient waveforms to said polarizing magnetic field along selected gradient axes; and
    a detector array for applying RF energy to excite nuclear spins of an object to be imaged, and for thereafter detecting signals generated by excited nuclei of said object to be imaged, said detector array comprising:
        a plurality of conductive array elements being substantially parallel to a conductive ground plane;
        a plurality of capacitors, wherein at least one capacitor is shunted from each array element to the ground plane configured to selectively adjust a corresponding electrical length of each conductive array element; and,
        wherein a combination of each respective array element, at least one corresponding capacitor and the ground plane forms a resonator that resonates at a selected frequency and the combination being adaptable for a plurality of field strengths; and,
        wherein signals detected by said detector array are processed by said computer to produce MR images of said object to be imaged.

13. The system of claim 12 further comprising a decoupling interface coupled to an end of each array element for decoupling each conductive array element from the remaining conductive array element when the array elements are mutual inductively coupled.

14. The system of claim 12 further comprising a plurality of matching devices for matching each decoupled conductive strip to a selected impedance for any unmatched strips.

15. The system of claim 12 wherein the detector array is operable as a receive-only detector.

16. The system of claim 12 wherein the detector array is operable as a transmit-only detector.

17. The system of claim 12 wherein the detector array is operable as a transmit and receive detector.

* * * * *

UNITED STATES PATENT AND TRADEMARK OFFICE
CERTIFICATE OF CORRECTION

PATENT NO. : 6,788,059 B2
DATED : September 7, 2004
INVENTOR(S) : Ray Fli Lee and William Alan Edelstein It is certified that error appears in the above-identified patent and that said Letters Patent is hereby corrected as shown below:

Column 9,
Line 7, Claim 1 should read as follows:
1. A radio frequency (RF) detector array for use with a magnetic resonance imaging (MRI) system, comprising:

a plurality of conductive array elements being substantially parallel to a conductive ground plane;

a plurality of capacitors, wherein at least one capacitor is shunted from each array element to the ground plane configured to selectively adjust a corresponding electrical length of each conductive array element; and, wherein a combination of each respective array element, at least one corresponding capacitor and the ground plane forms a resonator that resonates at a selected frequency and the combination being adaptable for a plurality of field strengths.

Signed and Sealed this

Nineteenth Day of April, 2005

JON W. DUDAS
*Director of the United States Patent and Trademark Office*